(12) United States Patent
Chen et al.

(10) Patent No.: US 8,686,509 B2
(45) Date of Patent: Apr. 1, 2014

(54) SEMICONDUCTOR STRUCTURE AND METHOD FOR MANUFACTURING THE SAME

(75) Inventors: Chien-Chih Chen, Hsinchu County (TW); Li-Fan Chen, Hsinchu (TW); Cheng-Chi Lin, Toucheng Township, Yilan County (TW); Shin-Chin Lien, New Taipei (TW); Shyi-Yuan Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/369,643

(22) Filed: Feb. 9, 2012

(65) Prior Publication Data

US 2013/0207191 A1  Aug. 15, 2013

(51) Int. Cl.
*H01L 23/62* (2006.01)
*H01L 21/82* (2006.01)

(52) U.S. Cl.
USPC .......................................... 257/355; 438/223

(58) Field of Classification Search
USPC ......... 438/217, 228, 238, 275, 306, 221, 294, 438/199; 257/E27.081, E27.086, 288, 296, 257/298, 360, 339, 355–357, 401
See application file for complete search history.

(56) References Cited

U.S. PATENT DOCUMENTS

| | | | |
|---|---|---|---|
| 6,320,230 B1 * | 11/2001 | Yu | 257/355 |
| 6,879,003 B1 * | 4/2005 | Cheng et al. | 257/355 |
| 7,067,887 B2 | 6/2006 | Chang et al. | |
| 7,129,546 B2 | 10/2006 | Ker et al. | |
| 2002/0109190 A1 * | 8/2002 | Ker et al. | 257/355 |
| 2008/0128818 A1 | 6/2008 | Chen et al. | |
| 2008/0203424 A1 | 8/2008 | Chen et al. | |
| 2009/0090919 A1 * | 4/2009 | Uchida | 257/77 |
| 2009/0256184 A1 * | 10/2009 | Lin et al. | 257/298 |

\* cited by examiner

*Primary Examiner* — Julio J Maldonado
*Assistant Examiner* — Moin Rahman
(74) *Attorney, Agent, or Firm* — McClure, Qualey & Rodack, LLP (57) ABSTRACT

A semiconductor structure and a method for manufacturing the same are provided. The semiconductor structure comprises a first doped region and a second doped region. The first doped region comprises a first contact region. The first doped region and the first contact region have a first type conductivity. The second doped region comprises a second contact region. The second doped region and the second contact region have a second type conductivity opposite to the first type conductivity. The first doped region is adjacent to the second doped region.

18 Claims, 10 Drawing Sheets

SEMICONDUCTOR STRUCTURE AND METHOD FOR MANUFACTURING THE SAME

BACKGROUND

1. Technical Field

The disclosure relates in general to a semiconductor structure and a method for manufacturing the same, and more particularly to a semiconductor structure having an ESD protection device and a method for manufacturing the same.

2. Description of the Related Art

Semiconductor structures are used in elements for many products such as MP3 players, digital cameras, computer, etc. As the application increases, the demand for the semiconductor structure focuses on small size and large circuit density. However, devices having different functions of the semiconductor structure usually are individually formed by manufacturing processes respectively. Thus, the manufacturing process for the semiconductor structure is complicated. In addition, the cost is high.

The electrostatic discharge (ESD) is a phenomenon of electrostatic charge transfer between different objects with the accumulation of the electrostatic charges. The ESD occurs for an extremely short period of time, which is only within the level of several nano-seconds (ns). A very high current is generated in the ESD event, and the value of the current is usually several amperes. Consequently, once the current generated by the ESD flows through a semiconductor structure, the semiconductor structure is usually damaged due to high power density. Thus, the ESD protection device has to provide a discharge path to prevent the semiconductor structure from being damaged when the electrostatic charges are generated in the semiconductor structure by machine or human body or charged device. However, in high voltage field, current ESD protection devices still can not provide a HV ESD protection effect, such as smaller than 2 KV. Therefore, the conventional ESD protection device can not be applied to protecting various HV devices.

SUMMARY

A semiconductor structure is provided. The semiconductor structure comprises a first doped region and a second doped region. The first doped region comprises a first contact region. The first doped region and the first contact region have a first type conductivity. The second doped region comprises a second contact region. The second doped region and the second contact region have a second type conductivity opposite to the first type conductivity. The first doped region is adjacent to the second doped region.

A method for manufacturing a semiconductor structure is provided. The method comprises following steps. A first doped region is formed in a substrate. The first doped region comprises a first contact region. The first doped region and the first contact region have a first type conductivity. A second doped region is formed in the substrate. The second doped region comprises a second contact region. The second doped region and the second contact region have a second type conductivity opposite to the first type conductivity. The first doped region is adjacent to the second doped region.

The above and other aspects of the disclosure will become better understood with regard to the following detailed description of the non-limiting embodiment(s). The following description is made with reference to the accompanying drawings.

DETAILED DESCRIPTION

Figure 1:
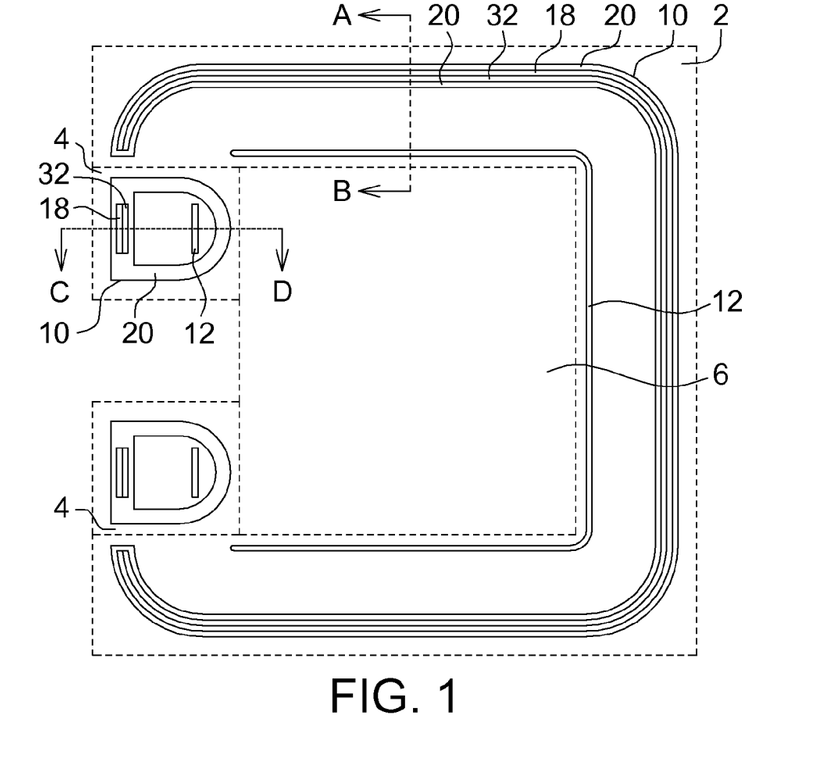
FIG. 1 illustrates a top view of a semiconductor structure in one embodiment.
Figure 2:
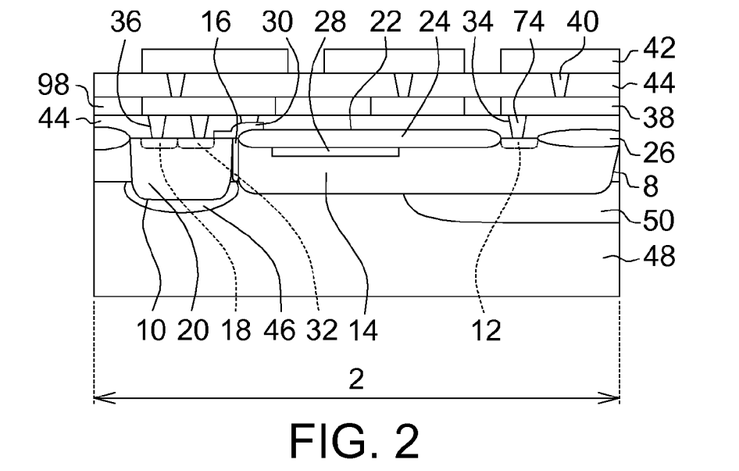
FIG. 2 illustrates a cross-section view of a semiconductor structure in one embodiment.
Figure 3:
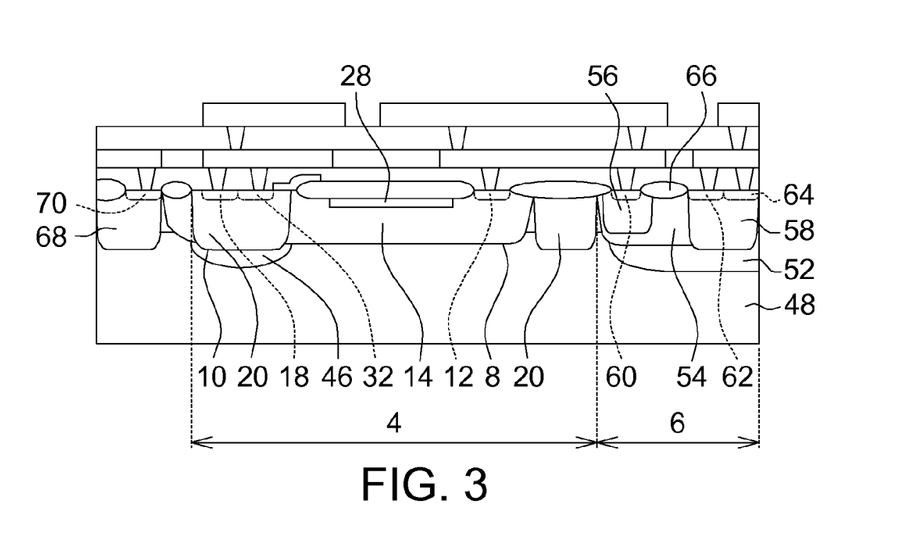
FIG. 3 illustrates a cross-section view of a semiconductor structure in one embodiment.

FIG. 1 illustrates a top view of a semiconductor structure in one embodiment. FIG. 2 and FIG. 3 illustrate cross-section views of the semiconductor structure in one embodiment. FIG. 2 is drawn along AB line in FIG. 1. FIG. 3 is drawn along CD line in FIG. 1.

Referring to FIG. 1, the semiconductor structure comprises a first device region 2, a second device region 4 and a third device region 6.

Referring to FIG. 2, the semiconductor structure in the first device region 2 comprises a first doped region 8 and a second doped region 10. The first doped region 8 may comprise a first contact region 12, a first body doped portion 14 and a side doped portion 16. For example, a dopant concentration of the side doped portion 16 is higher than a dopant concentration of the first body doped portion 14. The first contact region 12 is formed in the first body doped portion 14. The first contact region 12, the first body doped portion 14 and the side doped portion 16 have a first type conductivity such as N type conductivity. The second doped region 10 may comprise a second contact region 18 and a second body doped portion 20. The second contact region 18 is formed in the second body doped portion 20. The second contact region 18 and the second body doped portion 20 have a second type conductivity opposite to the first type conductivity. For example, the second type conductivity is P type conductivity. The side doped portion 16 of the first doped region 8 is adjacent to and between the first body doped portion 14 and the second body doped portion 20 in the second doped region 10. In embodiments, the first contact region 12 and the second contact region 18 are respectively a heavily doped region.

Referring to FIG. 2, a dielectric structure 22 is formed on the first doped region 8. In embodiments, the first contact region 12 of the first doped region 8 is defined by the dielectric structure 22. In detail, for example, the dielectric structure 22 comprises a first dielectric portion 24 and a second dielectric portion 26 separated from each other. The first contact region 12 is between the first dielectric portion 24 and the second dielectric portion 26.

A top doped layer 28 may be formed in the first body doped portion 14 between the first contact region 12 and the second contact region 18. In one embodiment, the top doped layer 28 has the second type conductivity such as P type conductivity.

A gate structure 30 may be formed on the side doped portion 16 of the first doped region 8 or the second body doped portion 20 of the second doped region 10 between the first contact region 12 and the second contact region 18. The gate structure 30 may comprise a gate dielectric layer at the bottom and a gate electrode layer on the gate dielectric layer. The gate dielectric layer may comprise an oxide or a nitride, such as silicon oxide or silicon nitride. The gate electrode layer may comprise a metal or polysilicon.

A third contact region 32 may be formed in the second body doped portion 20 of the second doped region 10. The third contact region 32 may have the first type conductivity such as N type conductivity. In one embodiment, the third contact region 32 is a heavily doped region.

A first conductive structure 34 is electrically connected to the first contact region 12 of the first doped region 8. A second conductive structure 36 is electrically connected to the second contact region 18 of the second doped region 10. The first conductive structure 34 and the second conductive structure 36 respectively have a conductive plug 74 and a conductive plug 40 in inter-metal dielectric layers (IMD) 44, and a conductive layer 38 in an inter-layer dielectric layer (ILD) 98 and a conductive layer 42 of various levels. The conductive plug 74, the conductive layer 38, the conductive plug 40 and the conductive layer 42 are electrically connected to each other. The conductive plug 74, the conductive layer 38, the conductive plug 40 and the conductive layer 42 may respectively comprise a metal such as W, Cu, etc.

A first doped buried region 46 formed in a substrate 48 is below the second doped region 10. The first doped buried region 46 has the first type conductivity such as N type conductivity. A doped buried region 50 formed in the substrate 48 is below the first doped region 8. The doped buried region 50 has the first type conductivity such as N type conductivity. The substrate 48 may have the second type conductivity such as P type conductivity.

Referring to FIG. 2, in embodiments, the semiconductor structure in the first device region 2 is functioned as an ESD protection device such as a diode ESD protection device. For example, the first conductive structure 34 is used for transmitting an electric current, generated from a touching to the semiconductor structure by a user, toward the first contact region 12. The electric current would flow to the second contact region 18 and the third contact region 32, through the first body doped portion 14, the side doped portion 16 and the second body doped portion 20. The second conductive structure 36 is used for transmitting the electric current away from the first contact region 12. It can be used as the ESD protection to prevent burn out in chip. In one embodiment, the second conductive structure 36 is electrically connected to a ground. Thus, the semiconductor structure in the first device region 2 can be used for protecting the semiconductor structure in other device regions such as the semiconductor structure in the second device region 4 and the third device region 6 in FIG. 1.

Referring to FIG. 1 and FIG. 2, the ESD effect of the semiconductor structure in the first device region 2 (ESD protection device) can be improved by following parts. For example, the first contact region 12 defined by the dielectric structure 22 can be used for collecting the ESD current for uniform turn-on. The side doped portion 16 can provide more donors so as to improve the ESD effect. The first doped buried region 46 and the doped buried region 50 can provide more donors so as to improve the ESD effect.

The semiconductor structure in the second device region 4 shown in FIG. 3 is different from the semiconductor structure in the first device region 2 shown in FIG. 2 in that the side doped portion 16 in FIG. 2 is omitted. In other words, the first body doped portion 14 of the first doped region 8 is adjacent to the second body doped portion 20 of the second doped region 10. Moreover, the doped buried region 50 in FIG. 2 is omitted. Referring to FIG. 1 and FIG. 3, in the second device region 4, the first body doped portion 14 of the first doped region 8 is surrounded by the second body doped portion 20 of the second doped region 10. The second body doped portion 20 can provide the semiconductor structure in the second device region 4 self-shielding (or self-isolation).

Referring to FIG. 1 and FIG. 3, in embodiments, semiconductor structure in the second device region 4 is a MOS device, such as a high-voltage (HV) NMOS or an ultra-HV (UHV) NMOS. For example, the first contact region 12 is functioned as a drain electrode. The third contact region 32 is functioned as a source electrode. The second contact region 18 is functioned as a bulk electrode.

Referring to FIG. 1 and FIG. 3, in embodiments, the third device region 6 is a HV region. Suitable devices such as a low-voltage MOS, a BJT, a capacitor, a resistor, etc., may be disposed in the third device region 6. Referring to FIG. 3, for example, a doped buried layer 52 is formed in the substrate 48. A well region 54 is formed on the doped buried layer 52. A well region 56 and a well region 58 are formed in the well region 54. A heavily doped region 60 is formed in the well region 56. A heavily doped region 62 and a heavily doped region 64 are formed in the well region 58. In one embodiment, the doped buried layer 52, the well region 54, the well region 56, the heavily doped region 60 and the heavily doped region 64 have the first type conductivity such as N type conductivity. The well region 58 and the heavily doped region 62 have the second type conductivity such as P type conductivity. A dielectric 66 is disposed between the heavily doped region 60 and the heavily doped region 62.

The semiconductor structure as shown in FIG. 3 comprises a well region 68 on the substrate 48. A heavily doped region 70 is formed in the well region 68. In one embodiment, the well region 68 and the heavily doped region 70 have the second type conductivity such as P type conductivity.

Referring to FIG. 3, in embodiments, a junction depth to the first body doped portion 14 is enough to sustain HV operation. The top doped layer 28 uses a RESURF concept. The doped buried layer 52 can avoid a punch through from the third device region 6 (HV region) to the semiconductor structure (ground). The first doped buried region 46 can provide an isolation between the third contact region 32 (source electrode) and the semiconductor structure.

FIG. 1 illustrates only the second doped region 10, the first contact region 12 and the third contact region 32 of the semiconductor structure in the first device region 2, and the second doped region 10, the first contact region 12 and the third contact region 32 of the semiconductor structure in the second device region 4.

Figure 4:
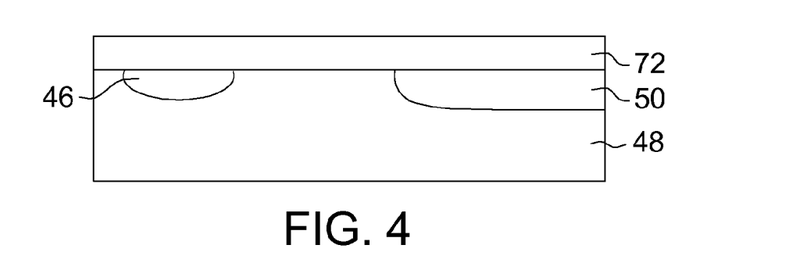
FIG. 4 to FIG. 8 illustrate a process for manufacturing a semiconductor structure in one embodiment.

FIG. 4 to FIG. 8 illustrate a process for manufacturing the semiconductor structure in the first device region 2 as shown in FIG. 2. Referring to FIG. 4, the first doped buried region 46 and the doped buried region 50 are formed in the substrate 48.

The first doped buried region 46 and the doped buried region 50 may be formed by doping a part of the substrate 48 not coved by a patterned mask layer (not shown). After the doping step, the patterned mask layer is removed. After the doping step, the first doped buried region 46 and the doped buried region 50 may be diffused by an annealing step. An epitaxial layer 72 may be formed on the substrate 48. In one embodiment, the epitaxial layer 72 has the second type conductivity such as P type conductivity. In another embodiment, the epitaxial layer 72 has the first type conductivity such as N type conductivity. Using the epitaxial layer 72 having the N type conductivity can increase the bulk voltage of the semiconductor structure.

Figure 5:
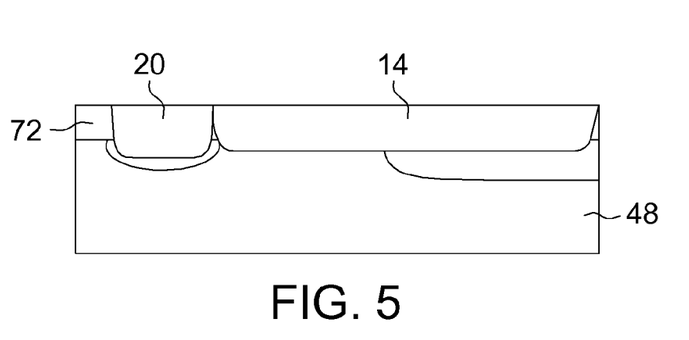

Referring to FIG. 5, the first body doped portion 14 may be formed by doping a part of the substrate 48 and the epitaxial layer 72 not coved by a patterned mask layer (not shown). After the doping step, the patterned mask layer is removed. After the doping step, the first body doped portion 14 may be diffused by an annealing step. The second body doped portion 20 may be formed by doping a part of the substrate 48 and the epitaxial layer 72 not coved by a patterned mask layer (not shown). After the doping step, the patterned mask layer is removed. After the doping step, the second body doped portion 20 may be diffused by an annealing step.

Figure 6:
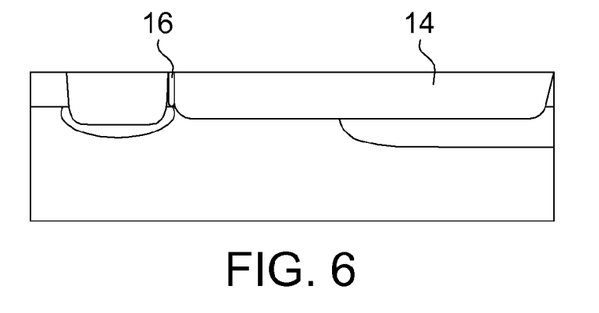

Referring to FIG. 6, the side doped portion 16 may be formed by doping a part of the first body doped portion 14 not coved by a patterned mask layer (not shown). After the doping step, the patterned mask layer is removed. After the doping step, the side doped portion 16 may be diffused by an annealing step.

Figure 7:
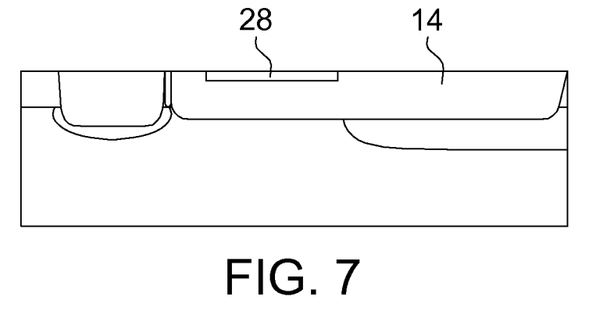

Referring to FIG. 7, the top doped layer 28 may be formed by doping a part of the first body doped portion 14 not coved by a patterned mask layer (not shown). After the doping step, the patterned mask layer is removed.

Figure 8:
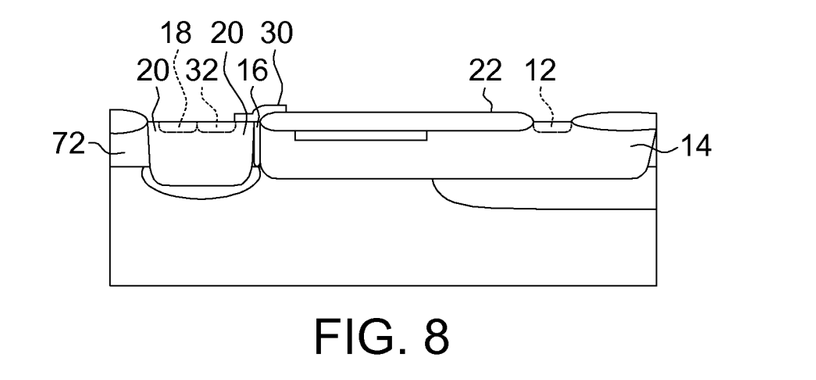

Referring to FIG. 8, the dielectric structure 22 may be formed on a part of the first body doped portion 14 and the epitaxial layer 72 not coved by a patterned mask layer (not shown). In this embodiment, the dielectric structure 22 is FOX. Next, the patterned mask layer is removed. The gate structure 30 is formed on the side doped portion 16 and the second body doped portion 20. A method for forming the gate structure 30 may comprise following steps. A gate dielectric layer is formed on the side doped portion 16 and the second body doped portion 20. A gate electrode layer is formed on the gate dielectric layer. Next, the gate dielectric layer and the gate electrode layer are patterned.

Referring to FIG. 8, the first contact region 12 and the third contact region 32 may be formed by doping a part of the first body doped portion 14 and the second body doped portion 20 not coved by a patterned mask layer (not shown). After the doping step, the patterned mask layer is removed.

Referring to FIG. 8, the second contact region 18 may be formed by doping a part of the second body doped portion 20 not coved by a patterned mask layer (not shown). After the doping step, the patterned mask layer is removed Referring to FIG. 2, the first conductive structure 34 and the second conductive structure 36 are formed. The conductive plug 74 and the conductive plug 40 of the first conductive structure 34 and the second conductive structure 36 are formed by filling a conductive material in a via formed in the inter-metal dielectric layer 44. The conductive layer 38 and the conductive layer 42 of the first conductive structure 34 and the second conductive structure 36 are formed by patterning a conductive film formed on the inter-metal dielectric layer 44. An opening in the conductive layer 38 is filled with the inter-layer dielectric layer 98.

In embodiments, the manufacturing process of the semiconductor structure in the first device region 2 can be incorporated with manufacturing process of the semiconductor structure in other device regions. Therefore, the semiconductor structure in the first device region 2, such as the ESD protection device does not need additional masks. In addition, the manufacturing process can be simplified, and the cost can be decreased. In embodiments, similar parts of the semiconductor structure in the first device region 2, the second device region 4 and the third device region 6 are formed simultaneously. For example, the first body doped portions 14 as shown in FIG. 2 and FIG. 3 are formed simultaneously. The second body doped portions 20 as shown in FIG. 2 and FIG. 3 are formed simultaneously. The first contact regions 12 and the third contact regions 32 are formed simultaneously. Embodiments may be applied to mix-mode or analog circuit designs, such as a LED lighting, an energy saving lamp, a ballast, a motor driver, etc.

Figure 9:
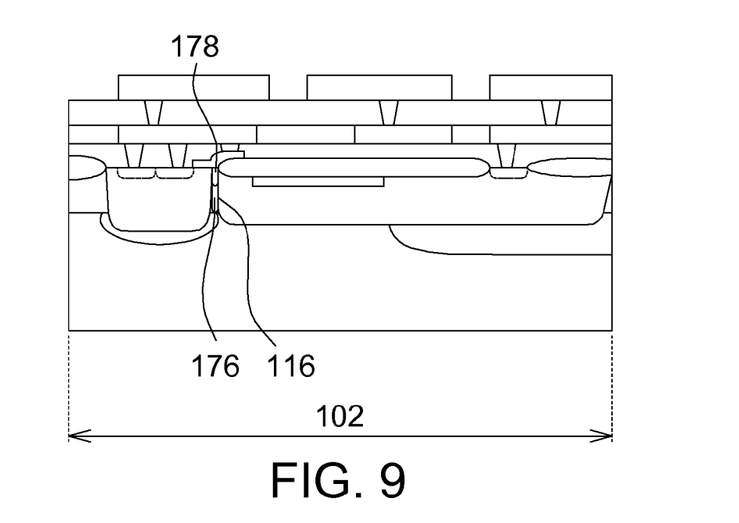
FIG. 9 illustrates a cross-section view of a semiconductor structure in one embodiment.

FIG. 9 illustrates a cross-section view of the semiconductor structure in the first device region 102 in one embodiment. The semiconductor structure shown in FIG. 9 is different from the semiconductor structure shown in FIG. 2 in that the side doped portion 116 comprises a first sub-side portion 176 and a second sub-side portion 178. The second sub-side portion 178 is formed in the first sub-side portion 176 by a doping step. In embodiments, the first sub-side portion 176 and the second sub-side portion 178 have the first type conductivity such as N type conductivity.

Figure 10:
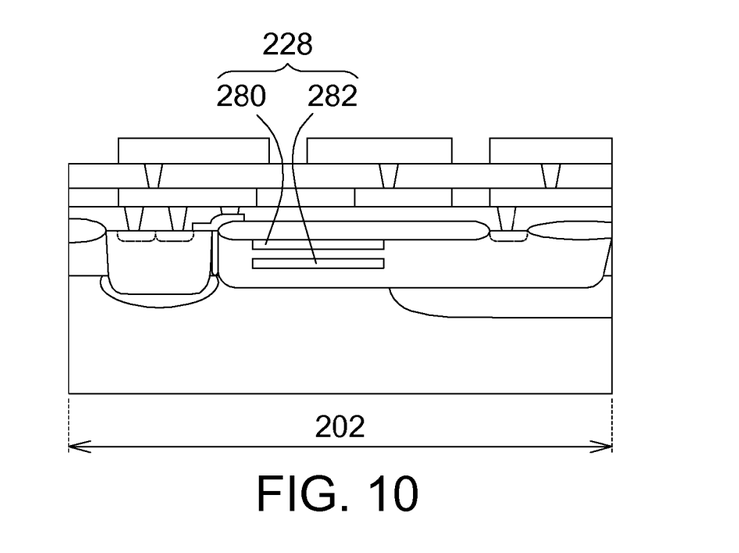
FIG. 10 illustrates a cross-section view of a semiconductor structure in one embodiment.

FIG. 10 illustrates a cross-section view of the semiconductor structure in the first device region 202 in one embodiment. The semiconductor structure shown in FIG. 10 is different from the semiconductor structure shown in FIG. 2 in that the top doped layer 228 comprises a doped layer portion 280 and a doped layer portion 282. The doped layer portion 280 and the doped layer portion 282 are arranged in a perpendicular direction.

Figure 11:
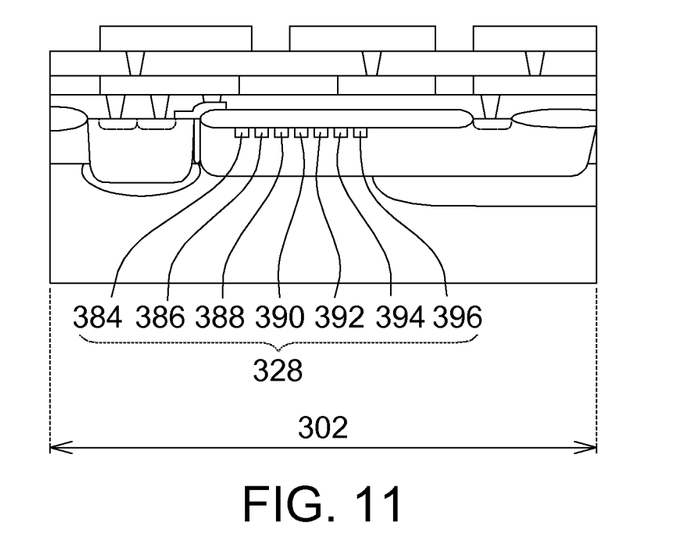
FIG. 11 illustrates a cross-section view of a semiconductor structure in one embodiment.

FIG. 11 illustrates a cross-section view of the semiconductor structure in the first device region 302 in one embodiment. The semiconductor structure shown in FIG. 11 is different from the semiconductor structure shown in FIG. 2 in that the top doped layer 328 comprises a doped layer portion 384, a doped layer portion 386, a doped layer portion 388, a doped layer portion 390, a doped layer portion 392, a doped layer portion 394 and a doped layer portion 396. The doped layer portion 384, the doped layer portion 386, the doped layer portion 388, the doped layer portion 390, the doped layer portion 392, the doped layer portion 394 and the doped layer portion 396 are arranged in a lateral direction, and are separated from each other.

Figure 12:
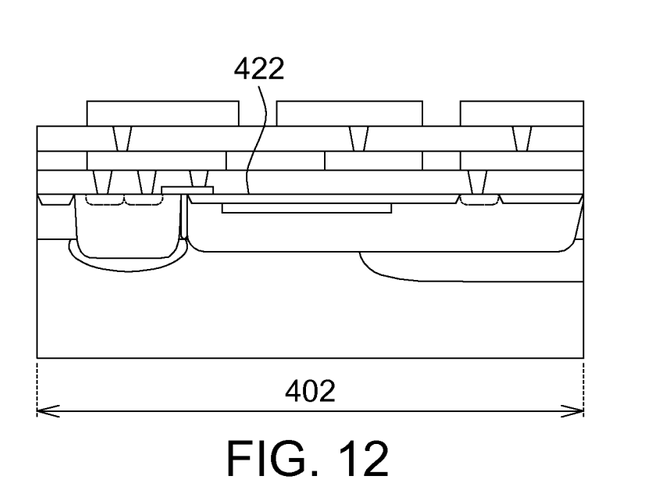
FIG. 12 illustrates a cross-section view of a semiconductor structure in one embodiment.

FIG. 12 illustrates a cross-section view of the semiconductor structure in the first device region 402 in one embodiment. The semiconductor structure as shown in FIG. 12 is different from the semiconductor structure as shown in FIG. 2 in that, the dielectric structure 422 is STI.

Figure 13:
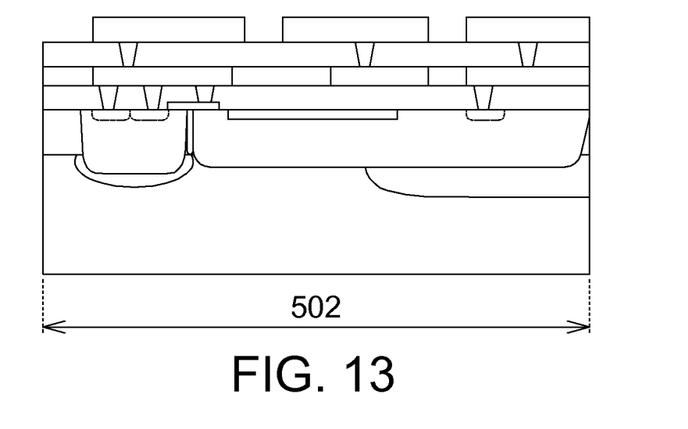
FIG. 13 illustrates a cross-section view of a semiconductor structure in one embodiment.

FIG. 13 illustrates a cross-section view of the semiconductor structure in the first device region 502 in one embodiment. The semiconductor structure as shown in FIG. 13 is different from the semiconductor structure as shown in FIG. 2 in that the dielectric structure 22 shown in FIG. 2 is omitted. Thus, the manufacturing cost is reduced.

Figure 14:
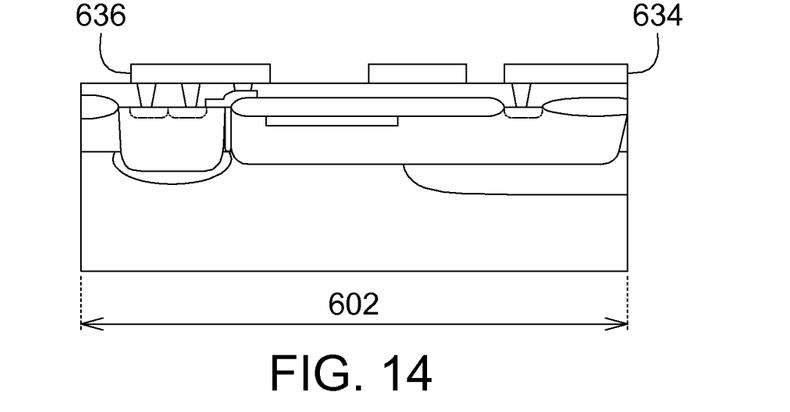
FIG. 14 illustrates a cross-section view of a semiconductor structure in one embodiment.

FIG. 14 illustrates a cross-section view of the semiconductor structure in the first device region 602 in one embodiment. Compared to the semiconductor structure shown in FIG. 2, the semiconductor structure shown in FIG. 14 has the first conductive structure 634 and the second conductive structure 636 of less levels (such as one level). Thus, the manufacturing cost is reduced.

Figure 15:
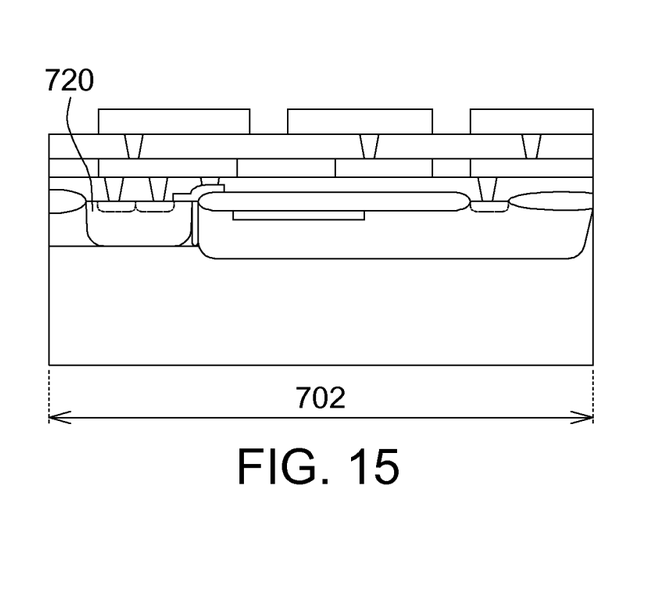
FIG. 15 illustrates a cross-section view of a semiconductor structure in one embodiment.

FIG. 15 illustrates a cross-section view of the semiconductor structure in the first device region 702 in one embodiment. The semiconductor structure as shown in FIG. 15 is different from the semiconductor structure as shown in FIG. 2 in that the first doped buried region 46 and the doped buried region 50 in FIG. 2 are omitted. Moreover, compared to the second conductive structure 36 in FIG. 2, the second body doped portion 720 in FIG. 15 has a shallower depth.

Figure 16:
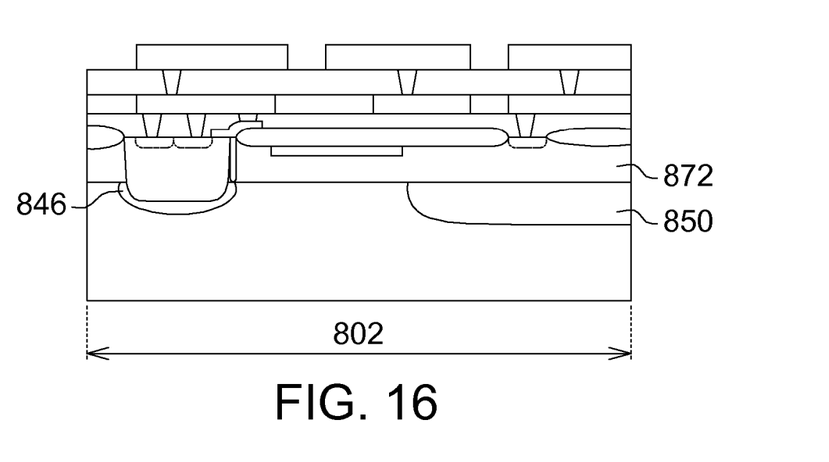
FIG. 16 illustrates a cross-section view of a semiconductor structure in one embodiment.

FIG. 16 illustrates a cross-section view of the semiconductor structure in the first device region 802 in one embodiment. The semiconductor structure as shown in FIG. 16 is different from the semiconductor structure as shown in FIG. 2 in that the epitaxial layer 872 having the first type conductivity such as N type conductivity is used. Thus, the first body doped portion 14 shown in FIG. 2 is omitted.

Figure 17:
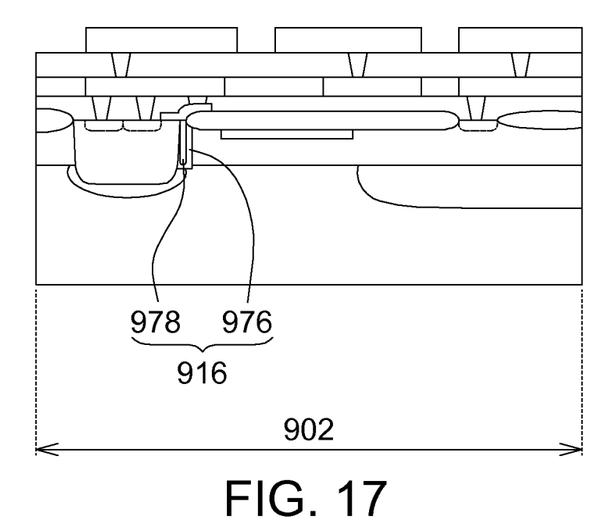
FIG. 17 illustrates a cross-section view of a semiconductor structure in one embodiment.

FIG. 17 illustrates a cross-section view of the semiconductor structure in the first device region 902 in one embodiment. The semiconductor structure as shown in FIG. 17 is different from the semiconductor structure as shown in FIG. 16 in that the side doped portion 916 comprises the first sub-side portion 976 and the second sub-side portion 978. The second sub-side portion 978 is formed in the first sub-side portion 976 by a doping step. In embodiments, the first sub-side portion 976 and the second sub-side portion 978 have the first type conductivity such as N type conductivity.

Figure 18:
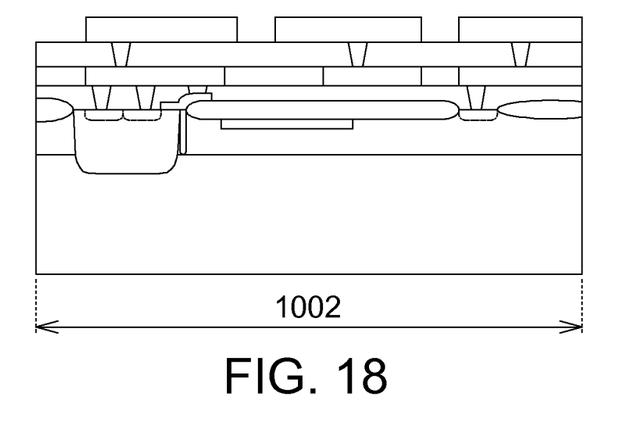
FIG. 18 illustrates a cross-section view of a semiconductor structure in one embodiment.

FIG. 18 illustrates a cross-section view of the semiconductor structure in the first device region 1002 in one embodiment. The semiconductor structure as shown in FIG. 18 is different from the semiconductor structure as shown in FIG. 16 in that the first doped buried region 846 and the doped buried region 850 in FIG. 16 are omitted.

Figure 19:
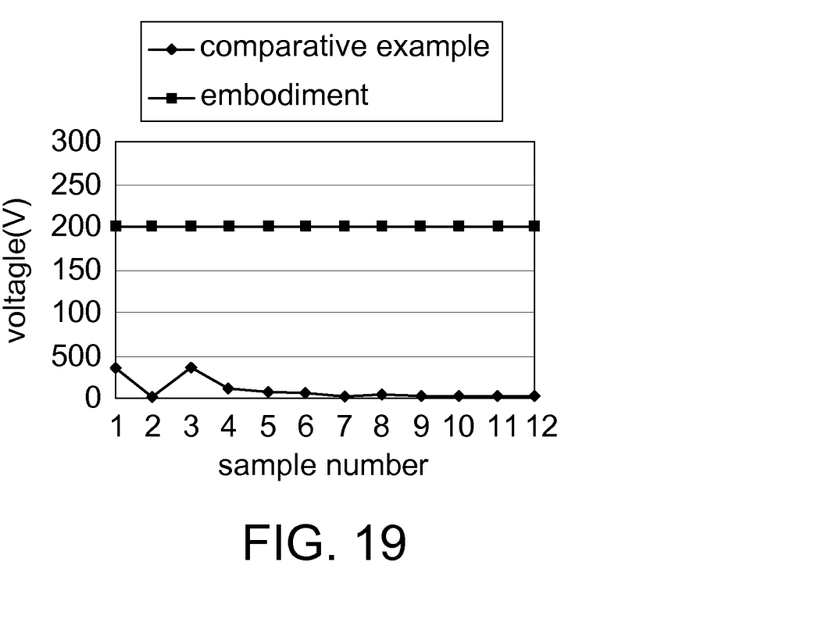
FIG. 19 shows ESD protection test results of embodiment and comparative example.

In embodiments, the semiconductor structure (ESD protection device) in the first device region can provide an ESD substantially higher than 3 KV. A breakdown voltage of the semiconductor structure (ESD protection device) in the first device region is higher than 650V. The semiconductor structure, such as a UHV NMOS) in the second device region may have a breakdown voltage higher than 650V. For example, from FIG. 19 showing ESD protection test results, it is observed that after the ESD protection device of the embodiment is applied an ESD voltage substantially higher than 2 KV, the operation voltage of the MOS device is maintained. On the contrary, the operation effect of the MOS is destroyed after the ESD protection device of the comparative example is applied an ESD voltage substantially higher than 2 KV.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a first doped region comprising a first contact region, a first body doped portion and a side doped portion, wherein the first doped region, the first contact region, the first body doped portion and the side doped portion have a first type conductivity, the first contact region is formed in the first body doped portion; and
    a second doped region comprising a second contact region and a second body doped portion, wherein the second doped region, the second contact region and the second body doped portion have a second type conductivity opposite to the first type conductivity, the second contact region is formed in the second body doped portion, the side doped portion is between the first body doped portion and the second body region.

2. The semiconductor structure according to claim 1, wherein the semiconductor structure is an ESD protection device.

3. The semiconductor structure according to claim 1, further comprising a first conductive structure electrically connected to the first contact region, wherein the first conductive structure is for transmitting an electric current toward the first contact region.

4. The semiconductor structure according to claim 1, further comprising a second conductive structure electrically connected to the second contact region, wherein the second conductive structure is for transmitting an electric current away from the second contact region.

5. The semiconductor structure according to claim 1, further comprising a gate structure on the first doped region or the second doped region between the first contact region and the second contact region.

6. The semiconductor structure according to claim 1, further comprising a dielectric structure formed on the first doped region, wherein the first contact region is defined by the dielectric structure.

7. The semiconductor structure according to claim 1, further comprising a dielectric structure formed on the first doped region, wherein the dielectric structure comprises a first dielectric portion and a second dielectric portion, the first contact region is between the first dielectric portion and the second dielectric portion.

8. The semiconductor structure according to claim 1, further comprising a top doped layer formed in the first doped region between the first contact region and the second contact region, wherein the top doped layer has the second type conductivity.

9. The semiconductor structure according to claim 8, wherein the top doped layer comprises doped layer portions.

10. The semiconductor structure according to claim 9, wherein the doped layer portions are arranged in a lateral direction and separated from each other.

11. The semiconductor structure according to claim 9, wherein the doped layer portions are arranged in a perpendicular direction.

12. The semiconductor structure according to claim 1, wherein the first contact region and the second contact region are respectively a heavily doped region.

13. The semiconductor structure according to claim 1, wherein a dopant concentration of the side doped portion is higher than a dopant concentration of the first body doped portion.

14. The semiconductor structure according to claim 1, wherein the side doped portion comprises a first sub-side portion and a second sub-side portion, wherein the first sub-side portion and the second sub-side portion have the first type conductivity, the second sub-side portion is formed in the first sub-side portion.

15. The semiconductor structure according to claim 1, further comprising a first doped buried region below the second doped region, wherein the first doped buried region has the first type conductivity.

16. The semiconductor structure according to claim 1, wherein the first doped region is surrounded by the second doped region.

17. A method for manufacturing a semiconductor structure, comprising:
    forming a first body doped portion having a first type conductivity in a substrate;

forming a second body doped portion having a second type conductivity opposite to the first type conductivity in the substrate;

forming a side doped portion having the first type conductivity between the first body doped portion and the second body region;

forming a first contact region having the first type conductivity in the first body doped portion, a first doped region comprising the first contact region, the first body doped portion and the side doped portion and having the first type conductivity;

forming a second contact region having the second type conductivity in the second body doped portion, a second doped region comprising the second contact region and the second body doped portion and having the second type conductivity; and forming only one gate structure on the first doped region or the second doped region between the first contact region and the second contact region.

18. The method for manufacturing the semiconductor structure according to claim 17, further comprising forming a first doped buried region in the substrate, wherein the first doped buried region has the first type conductivity, the second doped region is formed on the first doped buried region.

* * * * *